United States Patent
Yin et al.

(10) Patent No.: US 9,324,835 B2
(45) Date of Patent: Apr. 26, 2016

(54) METHOD FOR MANUFACTURING MOSFET

(71) Applicant: INSTITUTE OF MICROELECTRONICS, CHINESE ACADEMY OF SCIENCES, Beijing (CN)

(72) Inventors: Haizhou Yin, Poughkeepsie, NY (US); Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 14/430,690

(22) PCT Filed: Oct. 30, 2012

(86) PCT No.: PCT/CN2012/083749
  § 371 (c)(1),
  (2) Date: Mar. 24, 2015

(87) PCT Pub. No.: WO2014/063380
  PCT Pub. Date: May 1, 2014

(65) Prior Publication Data
  US 2015/0255577 A1   Sep. 10, 2015

(30) Foreign Application Priority Data
  Oct. 23, 2012 (CN) .......................... 2012 1 0407135

(51) Int. Cl.
  *H01L 29/78*    (2006.01)
  *H01L 29/66*    (2006.01)
  *H01L 21/336*   (2006.01)
  *H01L 21/02*    (2006.01)
  (Continued)

(52) U.S. Cl.
  CPC .... *H01L 29/66636* (2013.01); *H01L 21/02381* (2013.01); *H01L 21/02529* (2013.01);
  (Continued)

(58) Field of Classification Search
  CPC .................. H01L 21/76224; H01L 29/0847; H01L 21/266; H01L 21/26513
  USPC .................................. 438/285, 289; 257/347
  See application file for complete search history.

(56) References Cited

U.S. PATENT DOCUMENTS

| | | | | |
|---|---|---|---|---|
| 2003/0203550 A1* | 10/2003 | Lai | .................... | H01L 21/76224 |
| | | | | 438/199 |
| 2005/0017289 A1* | 1/2005 | Kim | .................. | H01L 29/42384 |
| | | | | 257/328 |

(Continued)

FOREIGN PATENT DOCUMENTS

CN      102623487 A    8/2012

OTHER PUBLICATIONS

International Search Report as issued in International Patent Application No. PCT/CN2012/083749, dated Jun. 6, 2013.

*Primary Examiner* — Ha Tran T Nguyen
*Assistant Examiner* — Thai T Vuong
(74) *Attorney, Agent, or Firm* — Pillsbury Winthrop Shaw Pittman LLP

(57) ABSTRACT

A method for manufacturing a MOSFET, including: performing ion implantation, via a shallow trench surrounding an active region in a semiconductor substrate, into a first sidewall of the active region and into a second sidewall of the active region opposite to the first sidewall to form a first heavily doped region in the first sidewall and a second heavily doped region in the second sidewall; filling the shallow trench with an insulating material, to form a shallow trench isolation; forming a gate stack and an insulating layer on the substrate, wherein the insulating layer surrounds and caps the gate stack; forming openings in the substrate using the shallow trench isolation, the first and second heavily doped regions, and the insulating layer as a hard mask; and epitaxially growing a semiconductor layer with a bottom surface and sidewalls of each of the openings as a seed layer.

14 Claims, 10 Drawing Sheets

(51) Int. Cl.
*H01L 21/265* (2006.01)
*H01L 29/04* (2006.01)
*H01L 29/08* (2006.01)
*H01L 21/266* (2006.01)
*H01L 21/306* (2006.01)
*H01L 21/762* (2006.01)
*H01L 29/06* (2006.01)
*H01L 29/161* (2006.01)

(52) U.S. Cl.
CPC ........ *H01L21/02532* (2013.01); *H01L 21/266* (2013.01); *H01L 21/26513* (2013.01); *H01L 21/26586* (2013.01); *H01L 21/30604* (2013.01); *H01L 21/76224* (2013.01); *H01L 29/045* (2013.01); *H01L 29/0653* (2013.01); *H01L 29/0847* (2013.01); *H01L 29/161* (2013.01); *H01L 29/665* (2013.01); *H01L 29/78* (2013.01)

(56) References Cited

U.S. PATENT DOCUMENTS

| | | | |
|---|---|---|---|
| 2005/0176207 A1* | 8/2005 | Liu | H01L 29/66484 438/306 |
| 2008/0150037 A1 | 6/2008 | Teo et al. | |
| 2009/0174002 A1* | 7/2009 | Ouyang | H01L 21/823807 257/369 |
| 2009/0267149 A1 | 10/2009 | Hua et al. | |
| 2010/0075477 A1* | 3/2010 | Seo | H01L 21/76213 438/296 |
| 2010/0193882 A1* | 8/2010 | Hoentschel | H01L 29/165 257/410 |
| 2011/0136311 A1* | 6/2011 | Shin | H01L 21/823807 438/285 |
| 2011/0193164 A1* | 8/2011 | Zhu | H01L 29/66795 257/347 |
| 2011/0312145 A1* | 12/2011 | Tsai | H01L 21/26586 438/300 |
| 2012/0139044 A1* | 6/2012 | Zhu | H01L 29/78648 257/347 |
| 2012/0164800 A1* | 6/2012 | Ikeda | H01L 21/26506 438/151 |
| 2012/0193708 A1* | 8/2012 | Flachowsky | H01L 21/2254 257/335 |
| 2013/0001665 A1* | 1/2013 | Zhu | H01L 21/2652 257/314 |

* cited by examiner

US 9,324,835 B2

METHOD FOR MANUFACTURING MOSFET

CROSS-REFERENCE TO RELATED APPLICATION(S)

This application is a national phase application of PCT Patent Application No. PCT/CN2012/083749, field on Oct. 30, 2012, entitled "METHOD FOR MANUFACTURING MOSFET," which claims priority to Chinese Application No. 201210407135.0, filed on Oct. 23, 2012, entitled "METHOD FOR MANUFACTURING MOSFET," which is incorporated herein by reference in its entirety.

TECHNICAL FIELD

The present disclosure relates to a method for manufacturing a semiconductor device, and in particular, to a method for manufacturing a MOSFET having enhanced stress.

BACKGROUND

An important trend in the development of the integrated circuitry technology is scaling down of metal-oxide-semiconductor field effect transistors (MOSFETs) to improve integration level and reduce manufacturing cost. However, the performance of semiconductor materials (e.g., carrier mobility) and the performance of the MOSFETs (e.g., threshold voltage) may also deteriorate as the size of the MOSFETs decreases.

A MOSFET may have increased carrier mobility due to appropriate stress being applied to a channel region thereof, resulting in a reduced ON resistance and an enhanced switching speed of the device. When the device is an n-type MOSFET, tensile stress may be applied to the channel region along a longitudinal direction thereof and compressive stress may be applied to the channel region along a lateral direction thereof, so as to improve the mobility of electrons as the carriers. On the other hand, when the transistor is a p-type MOSFET, compressive stress may be applied to the channel region along the longitudinal direction thereof and tensile stress may be applied to the channel region along the lateral direction thereof, so as to improve the mobility of holes as the carriers.

Desirable stress can be generated by forming a source region and a drain region using a semiconductor material different from that of a semiconductor substrate. For the n-type MOSFET, Si:C source and drain regions formed on a Si substrate may function as a stressor which applies the tensile stress to the channel region along the longitudinal direction thereof. For the p-type MOSFET, SiGe source and drain regions formed on a Si substrate may function as a stressor which applies the compressive stress to the channel region along the longitudinal direction thereof.

FIGS. 1-4 are schematic views showing semiconductor structures formed in various stages in a flow for manufacturing a MOSFET with enhanced stress according to a method of the prior art, in which FIGS. 1a, 2a, 3a and 4a show cross-section views of the respective semiconductor structures along a longitudinal direction of a channel region, FIGS. 3b and 4b show cross-section views of the respective semiconductor structures along a lateral direction of the channel region, and FIGS. 1b, 2b, 3c and 4c show top views of the respective semiconductor structures. In these figures, line AA represents a position where the cross-section views are taken along the longitudinal direction of the channel region, and line BB represents a position where the cross-section views are taken along the lateral direction of the channel region.

This method begins with the semiconductor structure shown in FIGS. 1a and 1b, in which a shallow trench isolation 102 is formed in a semiconductor substrate 101 to define an active region for the MOSFET. A gate stack surrounded by a spacer 105 is formed on the semiconductor substrate 101. The gate stack comprises a gate dielectric 103 and a gate conductor 104.

By using the shallow trench isolation 102, the gate conductor 104 and the spacer 105 as a hard mask, the semiconductor substrate 101 is etched to a desired depth so as to form openings in the semiconductor substrate at positions corresponding to a source region and a drain region, respectively, as shown in FIGS. 2a and 2b.

A semiconductor layer 106 is grown epitaxially on an exposed surface of the semiconductor substrate 101 within each of the openings so as to form the source region and the drain region. A portion of the semiconductor substrate 101 which is beneath the gate dielectric 103 and between the source region and the drain region functions as a channel region.

The semiconductor layer 106 is grown selectively from the surface of the semiconductor substrate 101. That is, the semiconductor layer 106 is grown at different growth rates on different crystalline surfaces of the semiconductor substrate 101. In an example in which the semiconductor substrate 101 comprises Si and the semiconductor layer 106 comprises SiGe with a Ge atomic percentage of about 10-15%, the semiconductor layer 106 has a slowest growth rate on a crystallographic surface $\{1\ 1\ 1\}$ of the semiconductor substrate 101. As a result, the formed semiconductor layer 106 comprises not only a main plane (100) parallel to the surface of the semiconductor substrate 101, but also facets $\{1\ 1\ 1\}$ at positions adjoining the shallow trench isolation 102 and the spacer 105, which is called an edge effect of the growth of the semiconductor layer 106, as shown in FIGS. 3a, 3b and 3c.

However, the small facets of the semiconductor layer 106 are not desirable because they cause more free surfaces, which release stress from the semiconductor layer 106, thereby reducing the stress applied to the channel region.

Next, the surface of the semiconductor layer 106 is silicidated to form a metal silicide layer 107, as shown in FIGS. 4a, 4b and 4c. The silicidation consumes a part of the semiconductor layer 106. Due to the existence of the small facets of the semiconductor layer 106, the silicidation may occur along the small facets and finally may even reach the semiconductor substrate 101.

However, the silicidation in the semiconductor substrate 101 is undesirable because it may form the metal silicide in a junction region, which leads to increased junction leakage.

Thus, it is desirable to suppress the edge effect in the semiconductor layer of the source and drain regions in the MOSFET with enhanced stress.

SUMMARY

The present disclosure aims to provide, among others, a method for manufacturing a MOSFET with enhanced channel stress and/or reduced junction leakage.

According to an aspect of the present disclosure, there is provided a method for manufacturing a MOSFET, comprising: forming a shallow trench surrounding an active region in a semiconductor substrate; performing first ion implantation into a first sidewall of the active region via the shallow trench, to form a first heavily doped region in the first sidewall; performing second ion implantation into a second sidewall of the active region opposite to the first sidewall via the shallow trench, to form a second heavily doped region in the second sidewall; filling the shallow trench with an insulating material, to form a shallow trench isolation for defining the active region for the MOSFET; forming a gate stack and an insulating layer on the semiconductor substrate, wherein the insulating layer serves as a spacer surrounding the gate stack and also as a cap covering the gate stack; forming openings in the semiconductor substrate with the shallow trench isolation, the first heavily doped region, the second heavily doped region and the insulating layer as a hard mask; epitaxially growing a semiconductor layer with a bottom surface and sidewalls of each of the openings as a seed layer; and performing ion implantation into the semiconductor layer to form source and drain regions.

According to this method, stress can be applied to a channel region in the semiconductor substrate by the source region and the drain region made of the semiconductor layer. Since the bottom surface and sidewalls of the opening is taken as the seed layer during the epitaxial growth, the semiconductor layer may fill up the opening in the semiconductor substrate completely. The semiconductor layer may have a {1 1 1} facet only present in a subsequently grown portion thereof, thereby suppressing the edge effect.

BRIEF DESCRIPTION OF THE DRAWINGS

FIGS. 1-4 are schematic views showing semiconductor structures formed in various stages in a flow for manufacturing a MOSFET with enhanced stress according to a method of the prior art, in which

FIGS. 5-12 are schematic views showing semiconductor structures formed in various stages in a flow for manufacturing a MOSFET with enhanced stress according to an embodiment of the present disclosure, in which FIGS. 5-6, 7a, 8a, and 9-12 show cross-section views of the respective semiconductor structures along a longitudinal direction of a channel region.

DETAILED DESCRIPTION

Figure 1A:
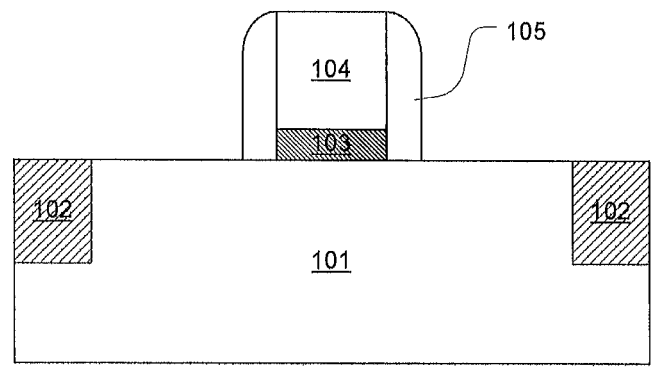
FIGS. 1a, 2a, 3a and 4a show cross-section views of the respective semiconductor structures along a longitudinal direction of a channel region.
Figure 1B:
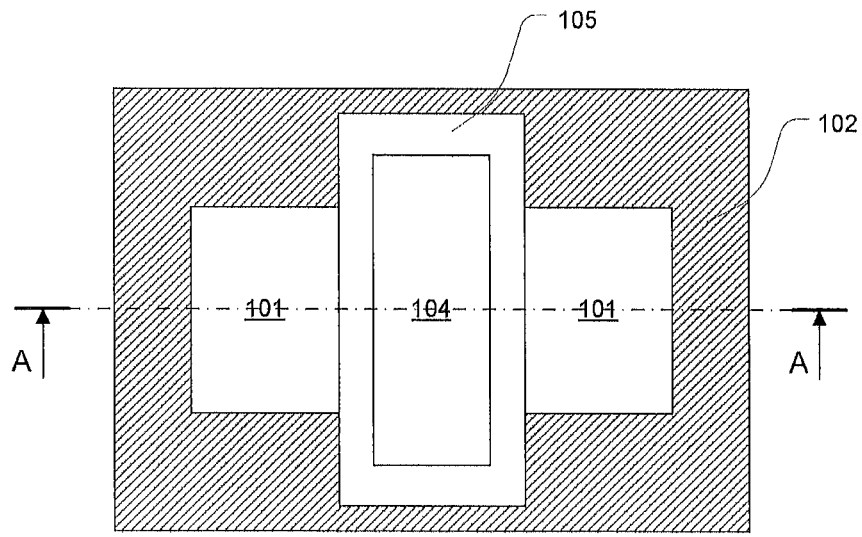
FIGS. 1b, 2b, 3c and 4c show top views of the respective semiconductor structures.
Figure 2A:
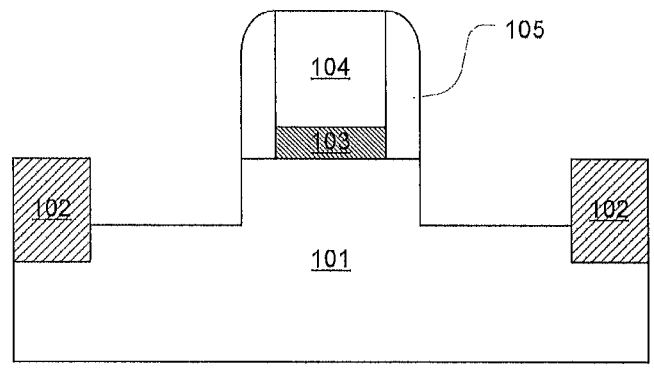
Figure 2B:
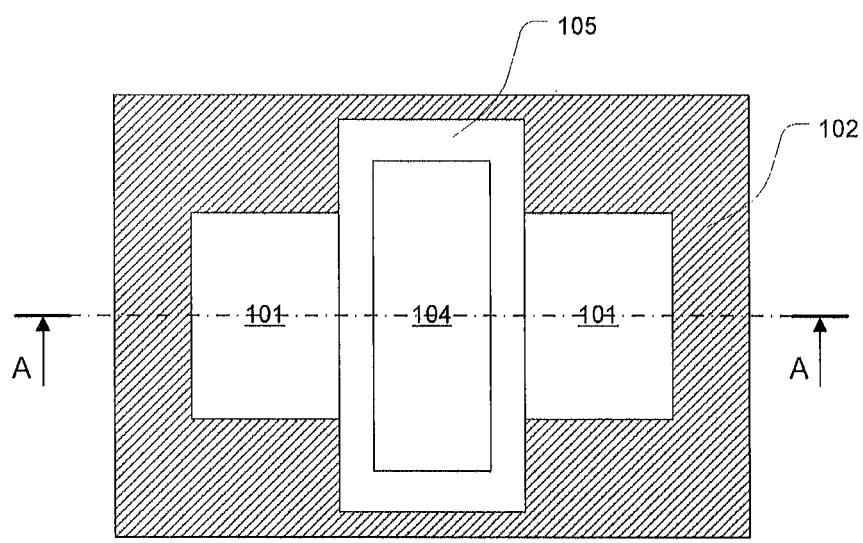
Figure 3A:
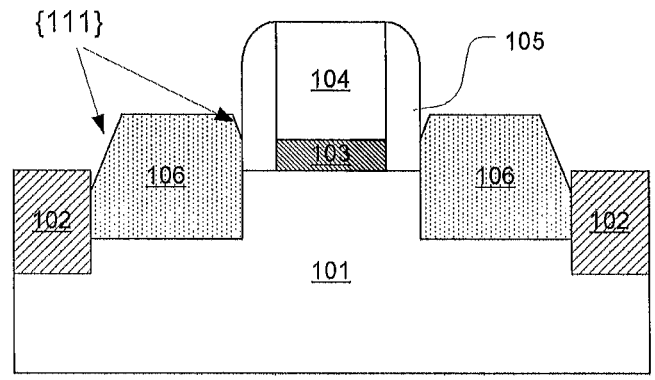
Figure 3B:
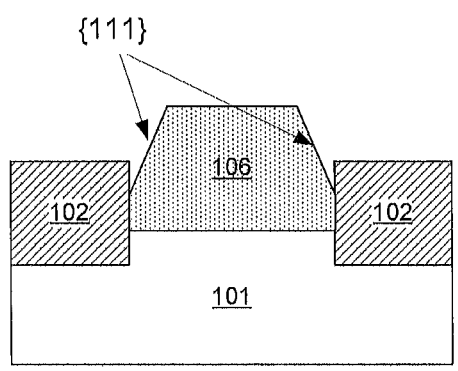
FIGS. 3b and 4b show cross-section views of the respective semiconductor structures along a lateral direction of the channel region.
Figure 3C:
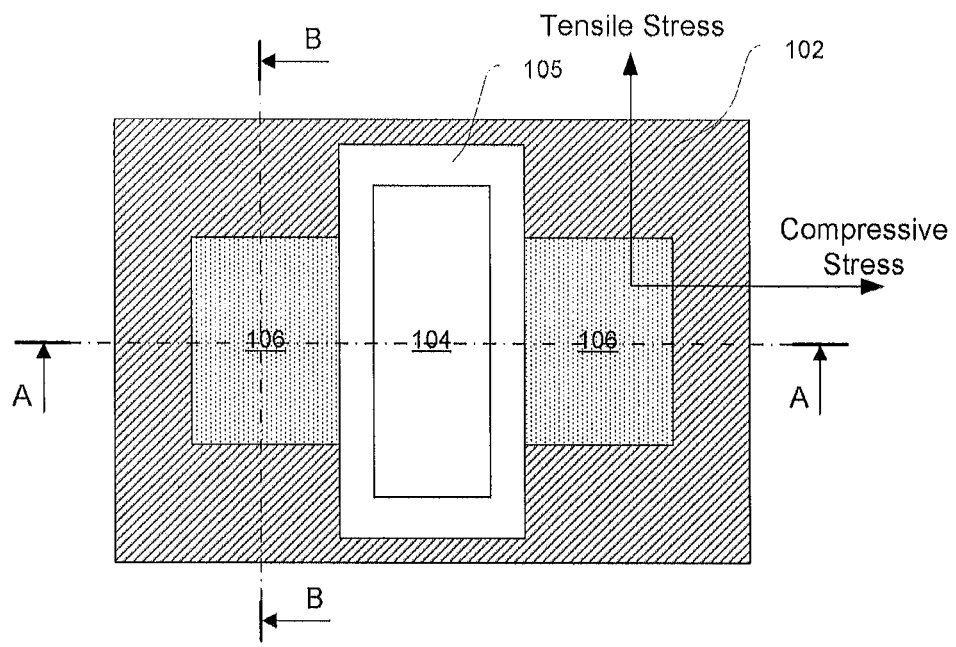
Figure 4A:
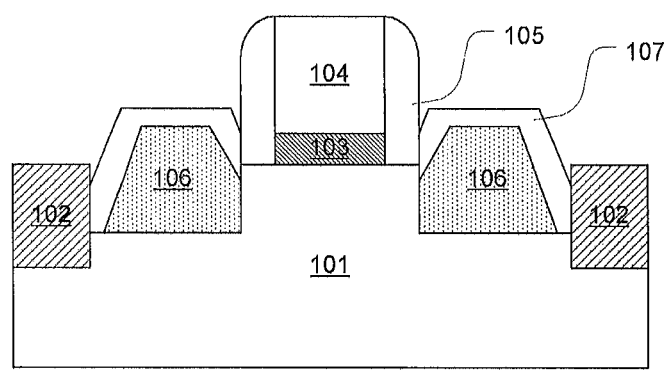
Figure 4B:
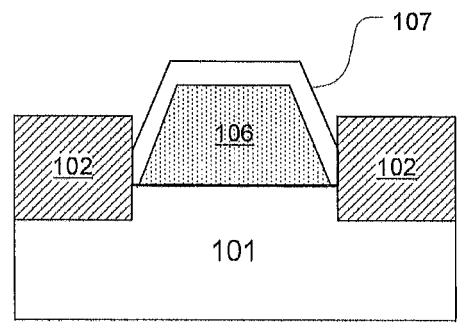
Figure 4C:
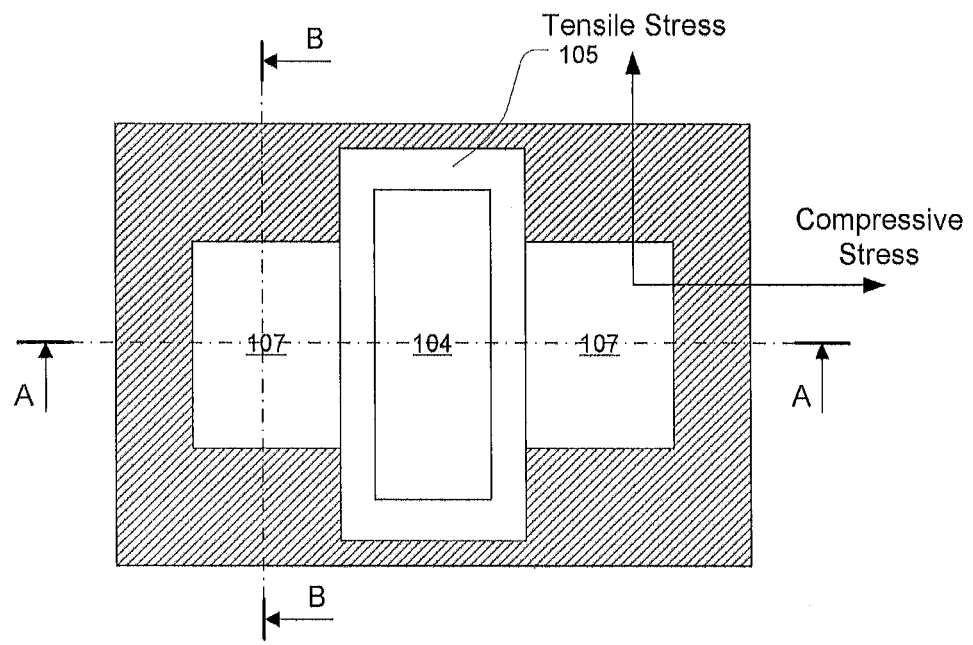

Exemplary embodiments of the present disclosure are described in detail below with reference to the accompanying drawings. In the drawings, like reference numerals denote like elements. The figures are not necessarily drawn to scale, for the sake of clarity.

A semiconductor structure obtained by several steps may be illustrated in one figure, for the sake of conciseness.

In descriptions of structures, when one layer or region is referred to as being "above" or "on" another layer or region, it can be directly above or on the other layer or region, or other layer(s) or region(s) may be arranged therebetween. Moreover, if the structure in the figures is turned over, the layer or region will be "under" or "below" the other layer or region.

In order to illustrate a situation in which one layer or region is directly on another layer or region, expressions such as "directly on" or "on and adjoining" may be utilized.

In the present disclosure, the term "semiconductor structure" refers generally to an entire semiconductor structure formed through various steps, which have been performed, of a method for manufacturing a semiconductor device, including all of the layers and regions that have been formed. The term "a longitudinal direction of a channel region" refers to a direction from a source region to a drain region or vice versa. The term "a lateral direction of a channel region" refers to a direction perpendicular to the longitudinal direction of the channel region in a plane parallel to a main surface of a semiconductor substrate. For example, for a MOSFET formed on a {1 0 0} silicon wafer, the longitudinal direction of the channel region is typically along a <110> direction of the silicon wafer and the lateral direction of the channel region is typically along a <011> direction of the silicon wafer.

Next, some particular details of the disclosure, such as exemplary structures, materials, dimensions, process steps and technologies, will be described for a better understanding of the present disclosure. Nevertheless, it should be understood by one skilled person in the art that the disclosure can be implemented without these details.

Unless indicated otherwise, each part of a MOSFET can be made of material(s) well-known to one skilled person in the art. A semiconductor material may comprise, for example, a III-V group semiconductor material such as GaAs, InP, GaN and SiC, or a IV group semiconductor such as Si and Ge. A gate conductor may comprise any of various conductive materials, for example, metal, doped polysilicon, a multilayer gate conductor including a metal layer and a doped polysilicon layer, or any other conductive material, such as TaC, TiN, TaTbN, TaErN, TaYbN, TaSiN, HfSiN, MoSiN, RuTax, NiTax, MoNx, TiSiN, TiCN, TaAlC, TiAlN, TaN, PtSix, $Ni_3Si$, Pt, Ru, Ir, Mo, HfRu, RuOx, or any combination thereof. A gate dielectric may comprise $SiO_2$ or any other dielectric material which has a dielectric constant greater than that of $SiO_2$, such as oxide, nitride, oxynitride, silicate, aluminate, or titanate. The oxide may include, for example, $SiO_2$, $HfO_2$, $ZrO_2$, $Al_2O_3$, $TiO_2$, or $La_2O_3$. The nitride may include, for example, $Si_3N_4$. The silicate may include, for example, HfSiOx. The aluminate may include, for example, $LaAlO_3$. The titanate may include, for example, $SrTiO_3$. The oxynitride may include, for example, SiON. Moreover, the gate dielectric may comprise any material that will be developed in the future, besides the above known materials.

According to embodiments of the present disclosure, a MOSFET with enhanced stress is manufactured by the following steps, which are described with reference to FIGS. 5-12. The figures schematically show cross-section views of semiconductor structures obtained in various stages of the method. Top views are shown as necessary in the figures, in which line AA represents a position where the cross-section views are taken along a longitudinal direction of a channel region.

Figure 5:
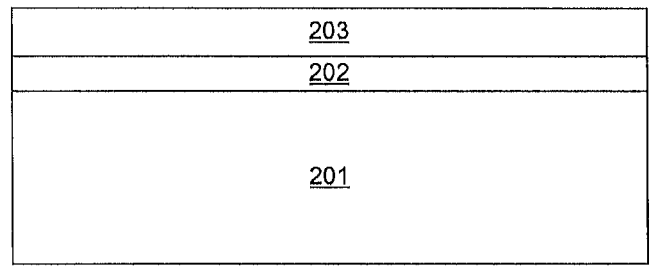

The method begins with a semiconductor structure shown in FIG. 5, in which a pad oxide layer 202 and a pad nitride layer 203 are formed in sequence on a semiconductor substrate 201. The semiconductor substrate 201 may comprise Si, for example. The pad oxide layer 202 may comprise silicon oxide and have a thickness of about 2-5 nm, for example. The pad nitride layer 203 may comprise silicon nitride and have a thickness of about 10-50 nm, for example. The pad oxide layer 202 may decrease stress between the semiconductor substrate 201 and the pad nitride layer 203 as well known. The pad nitride layer 203 may be used as a hard mask in a subsequent etching step.

The respective layers described above may be formed by known processes. The pad oxide layer 202 may be formed by thermal oxidization, for example. The pad nitride layer 203 may be formed by chemical vapor deposition, for example.

Then, a photoresist layer (not shown) is formed on the pad nitride layer 203 by spin-coating and the photoresist layer is subjected to a photolithography process including exposure and development to form a pattern for a shallow trench isolation. By using the photoresist layer as a mask, exposed portions of the pad nitride layer 203 and the pad oxide layer 202 are removed in sequence by dry etching such as ion milling, plasma etching, reactive ion etching, or laser ablation, or wet etching using an etching agent solution. The etching stops on a surface of the semiconductor substrate 201 and forms a pattern of the shallow trench isolation in the pad nitride layer 203 and the pad oxide layer 202. The photoresist layer is removed by ashing or being solved in a solvent.

Figure 6:
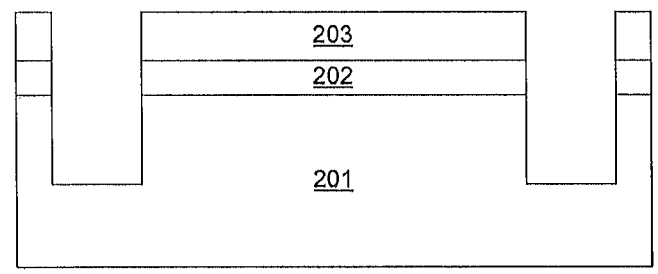

By using the pad nitride 203 and the pad oxide layer 202 together as a hard mask, the semiconductor substrate 201 is etched to a desired depth by dry etching or wet etching, so as to form a shallow trench in the semiconductor substrate 201, as shown FIG. 6. It can be understood by one skilled person in the art that the shallow trench surrounds an active region of the MOSFET.

Figure 7A:
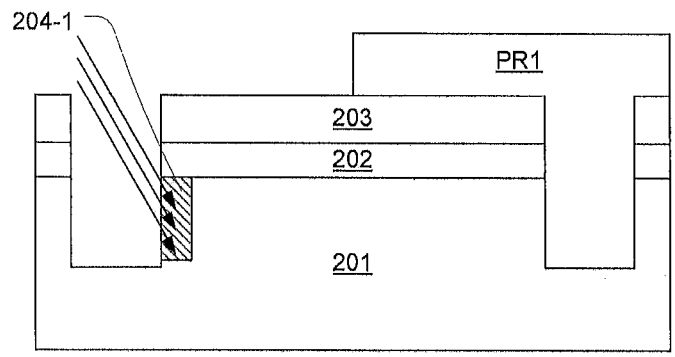
Figure 7B:
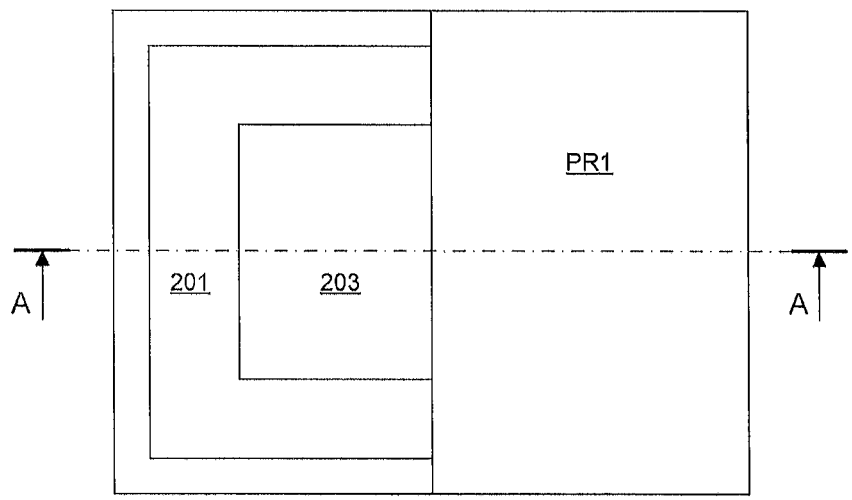
FIGS. 7b and 8b show top views of the respective semiconductor structures.

Then, a photoresist layer PR1 is formed on the pad nitride layer 203 by spin-coating, and is patterned by a lithography process to expose a first sidewall of the active region via the shallow trench in a longitudinal direction of a channel region to be formed. With the photoresist layer PR1 as a mask, first ion implantation is performed into the exposed first sidewall of the active region via the shallow trench, to form a heavily doped region 204-1, as shown in FIGS. 7a and 7b. In order to form the heavily doped region 204-1 on the exposed first sidewall (the left sidewall in the figure) of the active region, the first ion implantation is performed at a predetermined tilt angle relative to a vertical direction. In an example, dopants used in the first ion implantation comprise, for example, $BF_2$ or B, at an implantation energy less than 1 keV and an implantation dosage larger than $5 \times 10^{14}$ cm$^{-2}$, so that the heavily doped region 204-1 has a peak doping level larger than $7 \times 10^{19}$ cm$^{-3}$. Then, the photoresist layer PR1 is removed by ashing or being dissolved in a solvent.

Figure 8A:
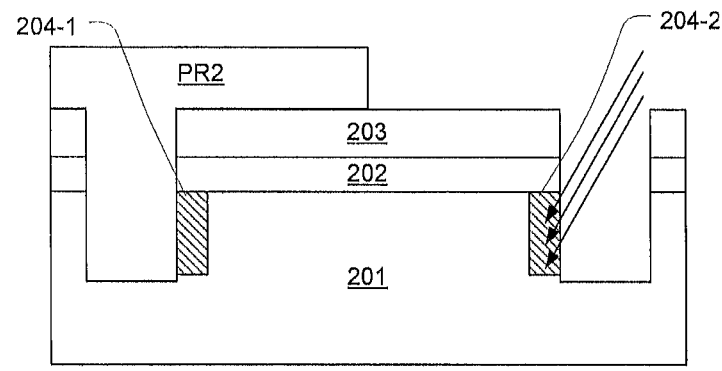
Figure 8B:
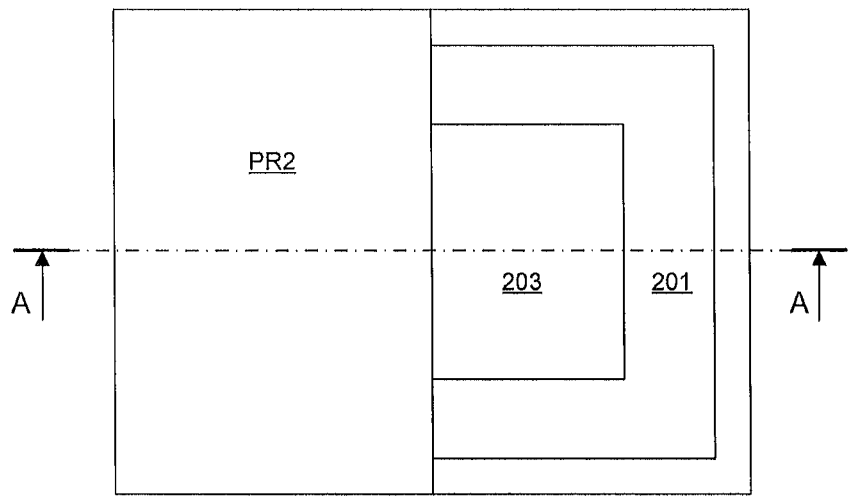

Then, a photoresist layer PR2 is formed on the pad nitride layer 203 by spin-coating, and is patterned by a lithography process to expose a second sidewall of the active region via the shallow trench in the longitudinal direction of the channel region to be formed. With the photoresist layer PR2 as a mask, second ion implantation is performed into the exposed second sidewall of the active region via the shallow trench, to form a heavily doped region 204-2, as shown in FIGS. 8a and 8b. In order to form the heavily doped region 204-2 on the exposed second sidewall (the right sidewall in the figure) of the active region, the second ion implantation is performed at a predetermined tilt angle relative to the vertical direction. The second ion implantation may be performed under the same conditions as the first ion implantation. Then, the photoresist layer PR2 is removed by ashing or being dissolved in a solvent.

Figure 9:
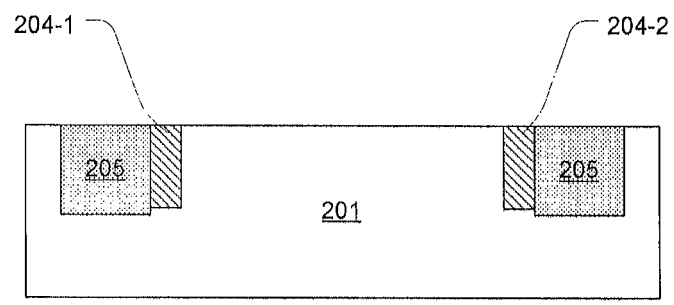

Next, an insulating material layer (not shown) is formed on a surface of the resultant semiconductor structure by deposition. The insulating material layer fills the shallow trench. Portions of the insulating material layer outside the shallow trench are removed by CMP (Chemical Mechanical Polishing), and the pad nitride layer 203 and the pad oxide layer 202 are further removed. The portion of the insulating material remaining in the shallow trench forms the shallow trench isolation 205, as shown in FIG. 9. It can be understood by one skilled person in the art that the shallow trench isolation 205 defines the active region for the MOSFET.

Figure 10:
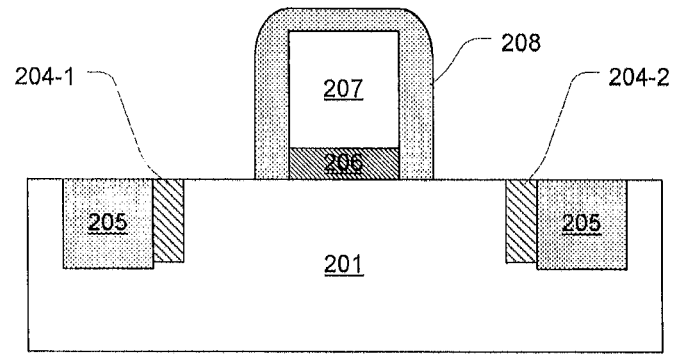

A dielectric layer and a poly silicon layer are formed in turn on a surface of the resultant semiconductor structure by deposition, and then patterned to form a gate stack including a gate dielectric 206 and a gate conductor 207. Next, a nitride layer 208 with a thickness of, for example, 10-50 nm is deposited on the whole surface of the semiconductor structure by any of the above described processes, and then etched anisotropically to form a spacer and a gap surrounding the gate stack, as shown in FIG. 10.

Figure 11:
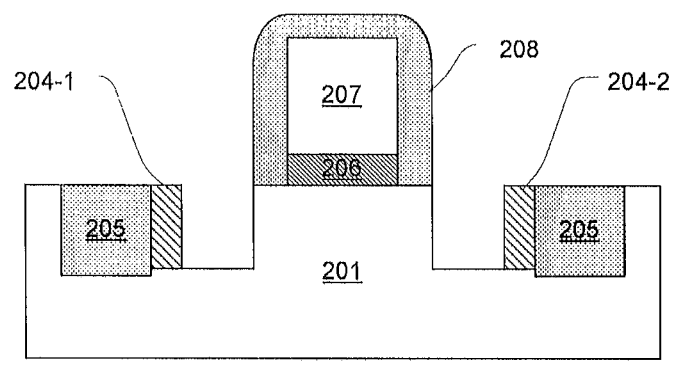

With the shallow trench isolation 205, the heavily doped regions 204-1 and 204-2, and the nitride layer 208 as a hard mask, the semiconductor substrate 201 is then etched to a desired depth, so as to form openings in the semiconductor substrate 201 at positions corresponding to the source and drain regions, as shown in FIG. 11. The etching is anisotropic or isotropic. However, due to the selectivity of the etching, the heavily doped regions 204-1 and 204-2 are substantially not etched. For example, an etchant used in the etching process may comprise solutions such as tetramethylammonium hydroxide (TMAH) or potassium hydroxide (KOH).

Next, a semiconductor layer 209 is epitaxially grown within each of the openings in the semiconductor substrate 201. It should be noted that the openings are not necessarily in the shape as shown in FIG. 11. For example, sidewalls of the openings on opposite sides of the gate stack as well as the spacer and cap 208 may be "Σ"-shaped sidewalls formed by wet etching with a crystalline surface index of {1 1 1}, The semiconductor layer 209 is selectively grown from the bottom surface and the sidewalls of the opening in the semiconductor substrate 201. That is to say, the semiconductor layer 209 is grown at different rates on different crystalline surfaces of the semiconductor substrate 201. In an example of a p-type MOSFET in which the semiconductor substrate 201 comprises Si and the semiconductor layer 209 comprises SiGe, the semiconductor layer 209 is grown slowest on a crystalline surface {1 1 1} of the semiconductor substrate 201. However, unlike the prior art, the bottom surface and the sidewalls of the opening in the semiconductor substrate 201 are all comprised of a semiconductor material. Although the heavily doped regions 204-1 and 204-2, as portions of the sidewalls of the openings, present selectivity with respect to the semiconductor substrate 201 in the etching step, the crystallographic characteristics thereof are similar to those of the semiconductor substrate 201 during the epitaxial growth of the semiconductor layer 209, and thus the heavily doped regions 204-1 and 204-2 also function as a seed layer. Therefore, the semiconductor layer 209 can completely fill up the openings of the semiconductor substrate 201.

Figure 12:
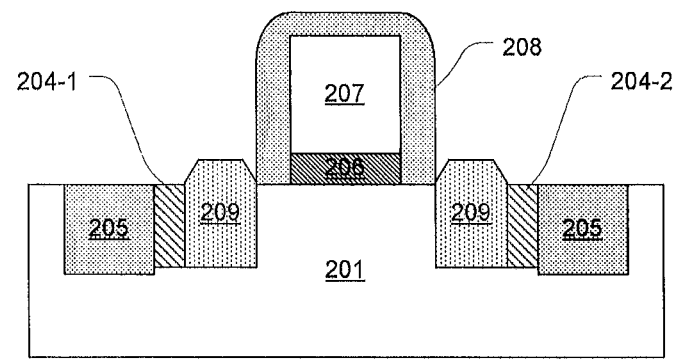

After completely filling up the openings, the semiconductor layer 209 loses the growing seed layer on the sidewalls of the openings, and thus continues being freely epitaxially grown. As a result, the continuously grown portion of the semiconductor layer 209 comprises not only a main surface of (100) parallel to the surface of the semiconductor substrate 201, but also {1 1 1} facets at positions adjacent to the nitride layer 208 and the heavily doped region 204-1/2, as shown in FIG. 12.

The {1 1 1} facet of the semiconductor layer 209 is only present within its continuously grown portion. The portion of the semiconductor layer 209 within the opening of the semiconductor substrate 201 has its bottom surface and sidewalls constrained. Thus, the facets of the semiconductor layer 209 would not disadvantageously affect the stress applied to the channel region.

Although not shown, after steps shown in FIGS. 5-12, ion implantation is implemented into the semiconductor layer 209, and spike anneal may be implemented at a temperature of about 1000-1080° C. to activate dopants implanted in the previous implantation step and eliminate damage caused by the implantation, so as to form the source region and the drain region. A portion of the semiconductor substrate below the gate dielectric 206 and between the source and drain regions functions as the channel region.

Preferably, silicidation is implemented at the surface of the semiconductor layer 209 to form a metal silicide layer so as to decrease a contact resistance of the source and drain regions.

The process of silicidation is known per se. For example, a Ni layer with a thickness of about 5-12 nm is deposited firstly and then is thermally treated at 300-500° C. for 1-10 seconds, so that the surface portion of the semiconductor layer 209 forms NiSi. Finally, the unreacted Ni is etched by wet etching.

The silicidation consumes some of the semiconductor material of the semiconductor layer 209. Since there are the facets of the semiconductor layer 209, the silicidation can occur along the facets. Since the semiconductor layer 209 completely fills up the openings in the semiconductor substrate 201, the silicidation does not reach the semiconductor substrate 201.

After the step shown in FIG. 12, other components of the MOSFET, such as an interlayer insulating layer, a via in the interlayer insulating layer and a wiring or electrode on an upper surface of the interlayer insulating layer, are formed on the resultant semiconductor structure.

Although the above embodiment illustrates the p-type MOSFET with enhanced stress and the material for the stressor used therein, the present disclosure is also applicable to an n-type MOSFET with enhanced stress. In the n-type MOSFET, the semiconductor substrate 201 comprises, for example, Si, and the semiconductor layer 209 comprises, for example, Si:C to form the source and drain regions, and functions as a stressor for applying tensile stress to the channel region along the longitudinal direction thereof. Except for the different materials for the stress, the n-type MOSFET with enhanced stress may be manufactured in a way similar to the above mentioned one.

The above descriptions are provided only to exemplify and illustrate the present disclosure, but are not intended to limit the present disclosure. Thus, the present disclosure is not limited to the illustrated embodiments. Any variant or modification apparent for those skilled in the art falls in the scope of the present disclosure.

We claim:

1. A method for manufacturing a MOSFET, comprising:
   performing first ion implantation, via a shallow trench surrounding an active region in a semiconductor substrate, into a first sidewall of the active region, to form a first heavily doped region in the first sidewall;
   performing second ion implantation, via the shallow trench, into a second sidewall of the active region opposite to the first sidewall, to form a second heavily doped region in the second sidewall;
   filling the shallow trench with an insulating material, to form a shallow trench isolation for defining the active region for the MOSFET;
   forming a gate stack and an insulating layer on the semiconductor substrate, wherein the insulating layer serves as a spacer surrounding the gate stack and as a cap covering the gate stack;
   forming openings in the semiconductor substrate using the shallow trench isolation, the first heavily doped region, the second heavily doped region and the insulating layer as a hard mask; and
   epitaxially growing a semiconductor layer with a bottom surface and sidewalls of each of the openings as a seed layer.

2. The method according to claim 1, further comprising forming the shallow trench surrounding the active region in the semiconductor substrate, wherein forming the shallow trench comprises:
   forming a first hard mask including a pattern of the shallow trench isolation on the semiconductor substrate; and
   etching the semiconductor substrate to form the shallow trench.

3. The method according to claim 2, wherein the first hard mask includes a pad oxide layer on the semiconductor substrate and a pad nitride layer on the pad oxide layer.

4. The method according to claim 1, wherein the performing first ion implantation comprises:
   forming a first photoresist mask, which shields the second sidewall of the active region while exposing the first sidewall of the active region;
   performing first ion implantation into the exposed first sidewall of the active region via the shallow trench isolation; and
   removing the first photoresist mask.

5. The method according to claim 1, wherein the performing second ion implantation comprises:
   forming a second photoresist mask, which shields the first sidewall of the active region while exposing the second sidewall of the active region;
   performing second ion implantation into the exposed second sidewall of the active region via the shallow trench isolation; and
   removing the second photoresist mask.

6. The method according to claim 1, wherein dopants used in first ion implantation and the second ion implantation comprise $BF_2$ and/or B.

7. The method according to claim 1, wherein each of the first ion implantation and the second ion implantation is performed at a predetermined tilt angle relative to a vertical direction.

8. The method according to claim 1, wherein the MOSFET comprises a p-type MOSFET.

9. The method according to claim 8, wherein the semiconductor substrate comprises Si and the semiconductor layer comprises SiGe.

10. The method according to claim 1, wherein the MOSFET comprises an n-type MOSFET.

11. The method according to claim 10, wherein the semiconductor substrate comprises Si and the semiconductor layer comprises Si:C.

12. The method according to claim 1, further comprising performing ion implantation into the semiconductor layer to form source and drain regions.

13. The method according to claim 1, further comprising forming the shallow trench surrounding the active region in the semiconductor substrate.

14. The method according to claim 12, wherein after forming the source and drain regions, the method further comprises: forming metal silicide on a surface of the source and drain regions by silicidation.

* * * * *